United States Patent [19]

Rumold et al.

[11] 4,066,950
[45] Jan. 3, 1978

[54] CIRCUIT FOR MEASURING THE GROUND RESISTANCE OF AN UNGROUNDED POWER CIRCUIT

[75] Inventors: Gerhard Rumold, Bubenreuth; Georg Russ, Erlangen, both of Germany

[73] Assignee: Siemens Aktiengesellschaft, Berlin & Munich, Germany

[21] Appl. No.: 721,852

[22] Filed: Sept. 9, 1976

[30] Foreign Application Priority Data

Sept. 25, 1975 Germany .............................. 2542811

[51] Int. Cl.² ...................... G01R 31/02; G01R 27/08
[52] U.S. Cl. ......................................... 324/51; 324/62
[58] Field of Search ................ 324/51, 52, 54, 62, 324/57 R; 340/255; 361/42, 49, 86

[56] References Cited

U.S. PATENT DOCUMENTS

| | | | |
|---|---|---|---|
| 3,281,681 | 10/1966 | Stevenson | 324/57 R X |
| 3,284,705 | 11/1966 | Dobson | 324/57 R |
| 3,935,512 | 1/1976 | Falk et al. | 324/51 X |
| 3,967,191 | 6/1976 | Roche | 324/62 X |
| 3,973,185 | 8/1976 | Beak et al. | 324/51 |

*Primary Examiner*—Gerard R. Strecker
*Attorney, Agent, or Firm*—Kenyon & Kenyon, Reilly, Carr & Chapin

[57] ABSTRACT

A measuring circuit for measuring the ground resistance of an ungrounded power circuit, particularly a d-c system supplied from a converter circuit in which a series circuit including an a-c voltage generator, a measuring resistor and a coupling member is connected between the object of the measurement and ground and an evaluation circuit including a phase sensitive rectifier circuit forms the unknown ground resistance by dividing the active component of the current driven by the generator voltage through the series circuit into the voltage between the measurement object and ground.

5 Claims, 11 Drawing Figures

CIRCUIT FOR MEASURING THE GROUND RESISTANCE OF AN UNGROUNDED POWER CIRCUIT

THE BACKGROUND OF THE INVENTION

This invention relates to measuring the ground resistance of an ungrounded power circuit in general and more particularly to a circuit for measuring the ground resistance in a d-c system supplied from a converter circuit.

By continuously measuring the ground resistance, a degradation of the insulation between ground and an ungrounded power circuit can be detected even before a short to ground actually occurs. In a measurement of the ground resistance of an ungrounded power circuit, the measurement result can be falsified by the ground capacity of the latter, the magnitude and distribution in space of which are not known.

SUMMARY OF THE INVENTION

It is an object of the present invention to provide a measuring circuit of the type mentioned at the outset in which the ground resistance, or a conductance reciprocal thereto, of an ungrounded power circuit is represented by a proportional voltage, which voltage is independent of the ground capacity.

According to the present invention, this problem is solved by the following features:

a. a series circuit which contains an a-c voltage generator, a measuring resistor and a coupling member, is connected between the object of the measurement and ground, b. a first measured voltage which is taken off at the junction between the series circuit and the object of the measurement, and a second measured voltage representing the current in the measuring resistor, are fed to the input terminals of an evaluation circuit, c. the evaluating circuit contains a divider, the first input of which is the first measured voltage coupled through a magnitude forming element and a mean forming element, and the second input of which is the second measured voltage, which is coupled through an in phase rectifier circuit and a further mean forming element.

The basic concept behind the measuring circuit according to the present invention is that the ground resistance of an ungrounded power circuit, or its conductance, is formed by the quotient of the active component of the current driven by the a-c voltage generator through the measuring circuit and the voltage in phase therewith which is present between the object of the measurement and ground. The unknown ground capacity is eliminated by measuring the active component of the current caused by the driving voltage of the a-c generator. This active component is measured by a phase sensitive rectifier circuit. The size of the coupling member, e.g., an R-C member, in the series circuit, has no effect on the measurement result, since the first measured voltage mentioned is taken off directly at the measurement object. The magnitude of the driving voltage of the a-c voltage generator also has no effect on the measurement result, since the ground resistance, or its conductance, is formed directly as the quotient of two measured voltages, both of which contain the driving voltage as a factor.

DETAILED DESCRIPTION OF THE INVENTION

Figure 1:
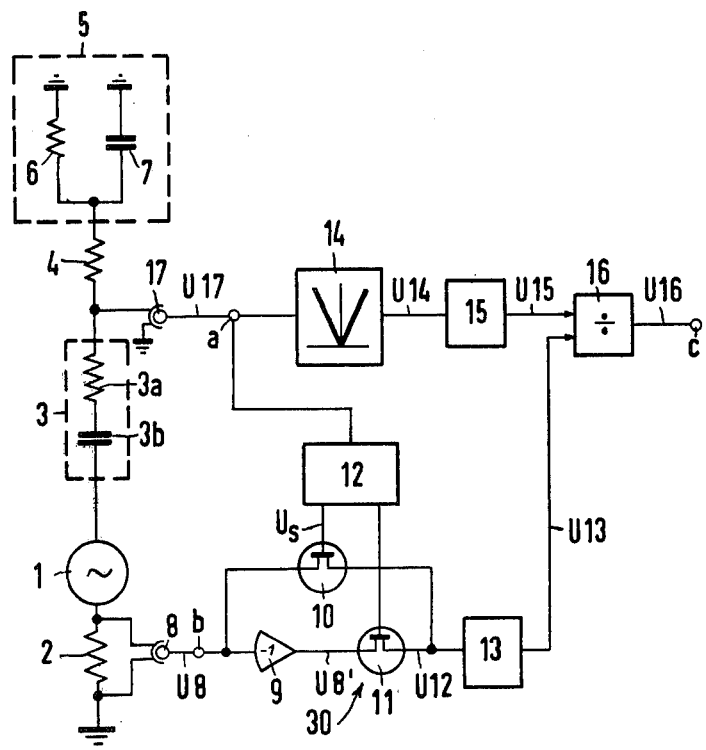
FIG. 1 is a block diagram of a measuring circuit according to the present invention.

In the illustration of FIG. 1, an a-c voltage generator 1 has its one side connected via a measuring resistor 2 to ground and its other side coupled through a coupling member 3 and a series resistor 4 to a measuring object 5. The frequency of the a-c voltage generator 1 is preferably in the range of 25 to 500 Hz. The measurement object 5 is shown schematically as a ground resistance 6 and ground capacity 7. The series resistor 4, the resistance of which may be, for instance, in the range between 20 ohm and 100 ohm is provided so that even where the ground resistance is small a corresponding input voltage is developed to be fed to an evaluation circuit. The coupling member 3 consists of an ohmic resistor 3a and a capacitor 3b in a series. The capacitor 3b is provided in order to reduce the losses in the ohmic resistor 3a. The resistance 3a in the coupling member 3 is designed so that in the event of a breakdown of the capacitor 3b, the short circuit currents that might occur are limited.

Figure 2:
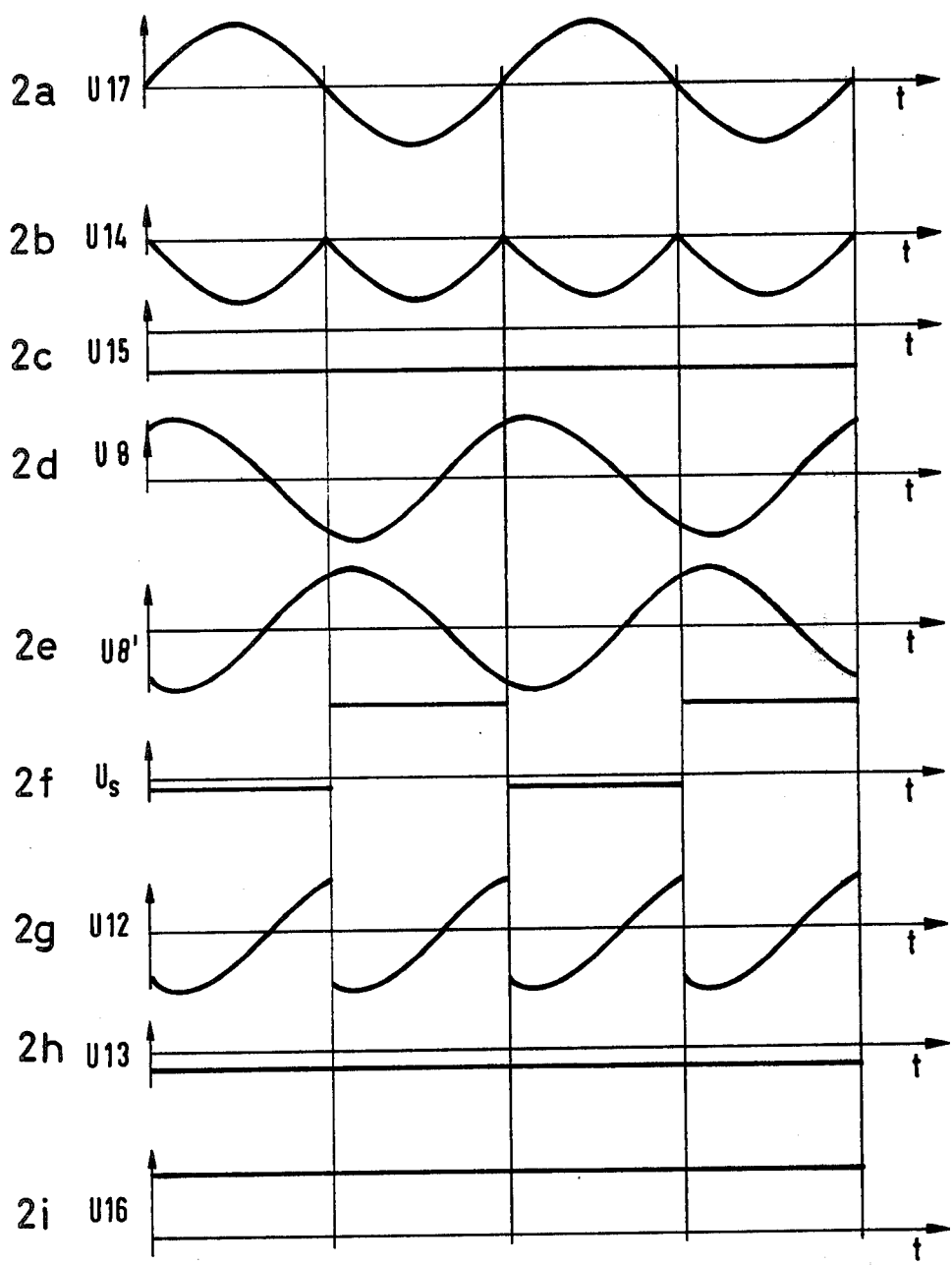
FIGS. 2a-2i illustrate essential signal waveforms of the circuit of FIG. 1.

A voltage measuring transformer 17 measures a first measured voltage between the measurement object 5 and ground. Transformer 17 is coupled to the junction point between the measurement object 5 and the coupling member 3. The first measured voltage U17 is fed to the input terminal a of an evaluation circuit. FIG. 2a shows the waveform of the first measured voltage U17.

A second voltage measuring transformer 8 is used for measuring the current driven through the measuring circuit by the generator voltage. It is connected to the two terminals of the measuring resistor 2. The second measuring voltage U8 is fed to the input terminal b of the evaluating circuit. FIG. 2d shows the waveform of the second measuring voltage U8.

The evaluating circuit contains a divider 16. The first measuring voltage U17 is fed to an absolute magnitude circuit 14, the output voltage U14 (FIG. 2b) of which is fed to a mean forming element 15 i.e., an averaging circuit. The output voltage U15 (FIG. 2c) of the mean forming element 16 is the first input to the divider 16.

The second measured voltage U8 is fed to a phase sensitive rectifier circuit 30, the output voltage U12 (FIG. 2g) of which is the input to a further mean forming element 13. The output voltage U13 (FIG. 2h) of the further mean forming element 13 is applied to the second input of the divider 16.

The phase sensitive rectifier circuit 20 contains two controlled electronic switches 10 and 11, which may be, for instance, FET transistors, along with an inverting amplifier 9. The two electronic switches 10 and 11 are alternately controlled into conduction and cut-off by a control unit 12. The first measured voltage U17, taken off at the point a, is fed to the input of the control unit 12. The control unit 12 may contain, for instance, a limit indicator which causes the switch 10 to conduct when the first measured voltage U17 has positive polarity and causes the switch 11 to conduct when the first measured voltage U17 is negative. FIG. 2f shows the waveform of the control $U_s$ for one of the two switches 10 or 11. The waveform for the other switch is the inverse thereof.

Through the synchronous actuation of the two switches 10 and 11, in phase with the first measured voltage U17, voltage sections that are in phase with the first measuring voltage U17 are filtered out from the second measured voltage U8 or the inverted second measured voltage U8′, inverted by the inverting amplifier 9. The physical meaning of this is that the active component of the current driven through the measuring circuit which is in phase with the voltage between the object of measurement 5 and ground is detected. The sections of the second measured voltage U8 and of the inverted second measuring voltage U8′, respectively, which are connected through by the switches 10 and 11, are combined and fed to a further mean forming element 13. In particular, active filters such as second order active filters, may be used as the mean forming elements 13 and 15.

The output voltage U13 of the mean forming element 13 and the output voltage U15 of the mean forming element 15 are fed to the inputs of the divider 16. Depending on the circuitry at the input of the divider 16, a voltage U16 (FIG. 2i) either representing the ground resistance or the conductance of the ground resistance 6 appears at its output terminal c.

Figure 3:
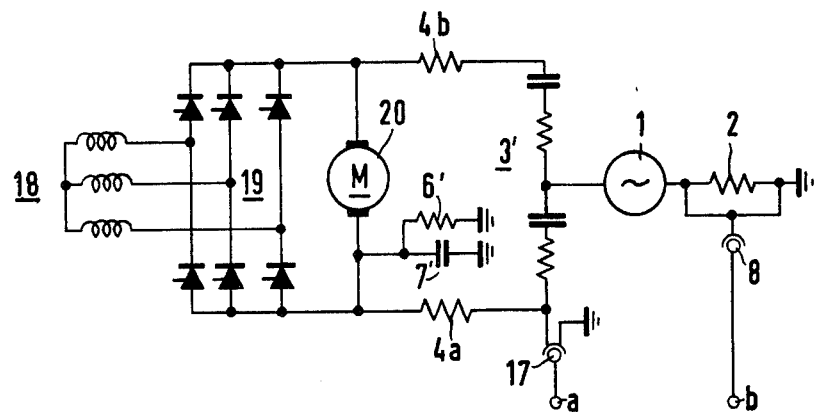
FIG. 3 illustrates the application of a measuring circuit according to the present invention to the measurement of the ground resistance of a converter supplied d-c machine.

FIG. 3 shows the application of a measuring circuit according to the present invention for determining the ground resistance of a d-c machine 20 which is supplied via a converter transformer 18 and converter 19. The ground resistance 6′ and the ground capacity 7′ of the d-c machine 20 are shown schematically. A symmetrical coupling member having two series connected R-C members with identical components couples the a-c voltage generator 1 to the d-c machine 20. The series resistor 4 of FIG. 1 is also divided into two symmetrical series resistors 4a and 4b. The voltage, referred to ground, between the coupling member 3′ and the object of the measurement is again measured by a voltage measuring transformer 17, and the voltage across the measuring resistor 2, representing, the current in the measuring circuit, by a voltage measuring transformer 8. The first and second measured voltages appearing at the terminals a and b are fed to an evaluating circuit such as that shown in FIG. 1.

In FIGS. 1 and 3, the measured voltages were taken off using respective measuring sensors schematically shown as voltage measuring transformers. If the amplitude of the voltage of the a-c voltage generator is chosen suitably, such a potential separating voltage coupling circuit can be dispensed with. The measuring voltages can then be taken off directly from the measuring circuit and fed to the rectifier 14 or the phase sensitive rectifier circuit.

We claim:

1. A circuit arrangement for measuring the ground resistance of an ungrounded power circuit comprising:
   a. a series circuit containing an ac voltage generator, a measuring resistor and a coupling member, coupled between the ungrounded power circuit and ground; and
   b. an evaluating circuit, having inputs coupled respectively to the point at which said series circuit is coupled to said ungrounded power circuit and across said measuring resistor to provide first and second voltage inputs proportional respectively to the voltage at said ungrounded power circuit and the current through said measuring resistor, for determining the ratio of the components of said voltage and current which are in phase with each other, said evaluating circuit comprising:
      1. an absolute magnitude circuit having as its input said first measured voltage;
      2. a mean forming circuit having the output of said absolute value circuit as an input;
      3. a phase sensitive rectifier circuit having as its input said second measured voltage, said rectifier circuit also coupled to said first measured voltage and providing at its output the portion of said second measured voltage which is in phase therewith;
      4. a second mean forming circuit having at its input the output of said phase sensitive rectifier circuit; and
      5. a divider having as inputs the outputs of said first and second mean forming circuits and providing an output which is one of the ground resistance and ground conductance of the circuit being measured.

2. Apparatus according to claim 1 wherein said phase sensitive rectifier comprises:
   a. an inverting amplifier having said second measured voltage at its input;
   b. first and second electronic switches each having an input terminal, an output terminal and a control terminal, the input terminal of said first electronic switch coupled to the input of said amplifier, the input of said second switch coupled to the output of said amplifier, the output of said two switches tied together and providing the input to said second mean forming circuit; and
   c. means having as an input said first measured voltage for forming first and second control signals coupled respectively to said first and second switches.

3. Apparatus according to claim 1 wherein said first and second measured voltages are coupled into said evaluating circuits through voltage transformers.

4. Apparatus according to claim 3 wherein said ungrounded power circuit is a dc system supplied from a converter circuit.

5. Apparatus according to claim 1 wherein said ungrounded power circuit is a dc system supplied from a converter circuit.

* * * * *